United States Patent
Komiyama et al.

(10) Patent No.: US 10,916,378 B2
(45) Date of Patent: Feb. 9, 2021

(54) CAPACITANCE ELEMENT HAVING CAPACITANCE FORMING UNITS ARRANGED AND ELECTRICALLY CONNECTED IN SERIES

(71) Applicant: Murata Manufacturing Co., Ltd., Nagaokakyo (JP)

(72) Inventors: Takashi Komiyama, Nagaokakyo (JP); Toshiyuki Nakaiso, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 350 days.

(21) Appl. No.: 16/031,299

(22) Filed: Jul. 10, 2018

(65) Prior Publication Data

US 2018/0321059 A1    Nov. 8, 2018

Related U.S. Application Data

(63) Continuation of application No. PCT/JP2017/007011, filed on Feb. 24, 2017.

(30) Foreign Application Priority Data

Mar. 18, 2016    (JP) .................................. 2016-056274

(51) Int. Cl.
  *H01G 4/40*    (2006.01)
  *H01G 4/33*    (2006.01)
  (Continued)

(52) U.S. Cl.
  CPC ........... *H01G 4/40* (2013.01); *G06K 19/0726* (2013.01); *H01G 2/06* (2013.01); *H01G 2/103* (2013.01);
  (Continued)

(58) Field of Classification Search
  CPC . H01G 2/06; H01G 5/011; H01G 4/40; H01L 27/016; G06K 19/0726
  See application file for complete search history.

(56) References Cited

U.S. PATENT DOCUMENTS

| 5,777,839 A | 7/1998 | Sameshima et al. |
| 9,018,732 B2* | 4/2015 | Nakaiso ................... H01G 4/33 257/532 |

(Continued)

FOREIGN PATENT DOCUMENTS

| JP | H05135999 A | 6/1993 |
| JP | H05235266 A | 9/1993 |

(Continued)

OTHER PUBLICATIONS

International Search Report issued for PCT/JP2017/007011, dated May 16, 2017.

(Continued)

*Primary Examiner* — Jeff W Natalini
(74) *Attorney, Agent, or Firm* — Arent Fox LLP

(57) ABSTRACT

A capacitance element that includes a first lower electrode and a second lower electrode arranged adjacent to each other in a Y-axis direction on a substrate. A first dielectric layer is on the first lower electrode, and a second dielectric layer is on the second lower electrode. A first upper electrode and a second upper electrode are arranged adjacent to each other in an X-axis direction on the first dielectric layer, and a third upper electrode and a fourth upper electrode are arranged adjacent to each other in an X-axis direction on the second dielectric layer. Interlayer conductors are respectively in contact with the first through fourth upper electrodes. A first connection conductor connects the second interlayer conductor and the fourth interlayer conductor to each other.

11 Claims, 8 Drawing Sheets

(51) Int. Cl.
*H01G 4/38* (2006.01)
*H01G 2/10* (2006.01)
*G06K 19/07* (2006.01)
*H01G 2/06* (2006.01)
*H01G 5/011* (2006.01)
*H01L 27/01* (2006.01)
*H01L 27/08* (2006.01)
*H01G 4/236* (2006.01)

(52) U.S. Cl.
CPC .............. *H01G 4/33* (2013.01); *H01G 4/385* (2013.01); *H01G 5/011* (2013.01); *H01G 4/236* (2013.01); *H01G 4/38* (2013.01); *H01L 27/016* (2013.01); *H01L 27/0805* (2013.01)

(56) References Cited

U.S. PATENT DOCUMENTS

2007/0267659 A1 11/2007 Aoki
2008/0068780 A1* 3/2008 Shioga .................. H01G 4/008
 361/524
2009/0090948 A1* 4/2009 Sato ...................... H01L 27/105
 257/296
2013/0314842 A1* 11/2013 Kang ...................... H01G 4/06
 361/303
2014/0139968 A1* 5/2014 Ikenaga .................. H01G 7/06
 361/281
2019/0295772 A1* 9/2019 Shin ........................ H01G 4/33

FOREIGN PATENT DOCUMENTS

JP 2005210065 A 8/2005
JP 2007335842 A 12/2007
JP 2008160047 A 7/2008
WO 2013183472 A1 12/2013

OTHER PUBLICATIONS

Written Opinion of the International Searching Authority issued for PCT/JP2017/007011, dated May 16, 2017.

* cited by examiner

CAPACITANCE ELEMENT HAVING CAPACITANCE FORMING UNITS ARRANGED AND ELECTRICALLY CONNECTED IN SERIES

CROSS REFERENCE TO RELATED APPLICATIONS

The present application is a continuation of International application No. PCT/JP2017/007011, filed Feb. 24, 2017, which claims priority to Japanese Patent Application No. 2016-056274, filed Mar. 18, 2016, the entire contents of each of which are incorporated herein by reference.

FIELD OF THE INVENTION

The present invention relates to a capacitance element, and more particularly to a capacitance element in which a plurality of capacitance forming units are arranged on a substrate and electrically connected to one another in series.

BACKGROUND OF THE INVENTION

For example, Patent Document 1 discloses a capacitance element in which a plurality of lower electrodes are arranged with a predetermined gap therebetween in one direction on a substrate and in which two upper electrodes are arranged with a predetermined gap therebetween in the one direction on the plurality of lower electrodes with a dielectric layer interposed between each of the upper electrodes and the corresponding lower electrode, so that two capacitance forming units in each of which the dielectric layer is sandwiched between a lower electrode layer and an upper electrode layer are formed. In the capacitance element, extended electrodes are each provided on one of the two upper electrode layers so as to be independent of each other.

Patent Document 1: Japanese Unexamined Patent Application Publication No. 2005-210065

SUMMARY OF THE INVENTION

FIG. 10 illustrates the basic configuration of the capacitance element disclosed in Patent Document 1. In the capacitance element, a plurality of lower electrodes 21 and 22 and so forth are arranged at a predetermined pitch in one direction on a substrate 1, and a pair of upper electrodes 41 and 42 are arranged, with a predetermined gap therebetween, on each of the lower electrodes 21 and 22 with a dielectric layer interposed between the pair of upper electrodes 41 and 42 and each of the lower electrodes 21 and 22. In this configuration, the dielectric layer is sandwiched between a lower electrode layer and an upper electrode layer, and four capacitance forming units are formed. Each of the upper electrodes 41 is connected to one of the upper electrodes 42 that is adjacent to the upper electrode 41 by interlayer conductors and a connection conductor 60.

However, as illustrated in FIG. 10, when the upper electrodes 41 and 42 each have a shape that has a long side in a direction perpendicular to the direction in which the upper electrodes 41 and 42 are arranged, the maximum value of the distance from an edge end of each of the upper electrodes 41 and 42 to a corresponding one of the interlayer conductors (dimension R in FIG. 10) is large. In such a structure, the resistance of each of the upper electrodes 41 and 42 is high, and thus, the equivalent series resistance (ESR) of the capacitance element is large. Although the ESR can be reduced by increasing the number of or the cross-sectional area of the interlayer conductors, when the interlayer conductors are formed, an oxygen (O) component included in the dielectric layers easily escapes through contact holes, and the dielectric constant of the dielectric layer varies from a predetermined value. Therefore, it is important to keep the number of and the area of the interlayer conductors to a minimum.

It is therefore an object of the present invention to provide a capacitance element having a reduced ESR without increasing the number of or the area of interlayer conductors.

A capacitance element according to an aspect of the present invention includes a substrate that has a surface extending in an X-axis direction and a Y-axis direction in an X-Y rectangular coordinate system, a first lower electrode and a second lower electrode on the surface of the substrate and positioned adjacent to each other in the Y-axis direction, a first dielectric layer on the first lower electrode, a second dielectric layer on the second lower electrode, a first upper electrode and a second upper electrode on the first dielectric layer and positioned adjacent to each other in the X-axis direction, a third upper electrode and a fourth upper electrode on the second dielectric layer and positioned adjacent to each other in the X-axis direction, a first interlayer conductor in contact with the first upper electrode, a second interlayer conductor in contact with the second upper electrode, a third interlayer conductor in contact with the third upper electrode, a fourth interlayer conductor in contact with the fourth upper electrode, and a first connection conductor that connects the second interlayer conductor and the fourth interlayer conductor to each other. The third upper electrode is positioned adjacent to the first upper electrode in the Y-axis direction. The fourth upper electrode is positioned adjacent to the second upper electrode in the Y-axis direction. The first connection conductor extends in the Y-axis direction.

With the above-described configuration, the X-axis direction in which the first upper electrode and the second upper electrode are arranged adjacent to each other is a direction perpendicular to the direction in which the first connection conductor extends, and thus, the difference between a minimum value of a distance from a portion of the second upper electrode, the portion being in contact with the second interlayer conductor, to an outer edge of the second upper electrode and a maximum value of the distance can be reduced. Similarly, the X-axis direction in which the third upper electrode and the fourth upper electrode are arranged adjacent to each other is a direction perpendicular to the direction in which the first connection conductor extends, and thus, the difference between a minimum value of a distance from a portion of the fourth upper electrode, the portion being in contact with the fourth interlayer conductor, to an outer edge of the fourth upper electrode and a maximum value of the distance (the ratio of the minimum value to the maximum value) can be reduced. As a result, the resistance of each of the first upper electrode, the second upper electrode, the third upper electrode, and the fourth upper electrode may be reduced, and a capacitance element having a low ESR may be obtained.

It is preferable that a ratio of a maximum value of a distance from a portion of the first upper electrode in contact with the first interlayer conductor to an outer edge of the first upper electrode to a minimum value of the distance is less than 2. It is preferable that a ratio of a maximum value of a distance from a portion of the second upper electrode in contact with the second interlayer conductor to an outer edge of the second upper electrode to a minimum value of the distance is less than 2. It is preferable that a ratio of a maximum value of a distance from a portion of the third upper electrode in contact with the third interlayer conductor to an outer edge of the third upper electrode to a minimum value of the distance is less than 2. It is preferable that a ratio of a maximum value of a distance from a portion of the fourth upper electrode in contact with the fourth interlayer conductor to an outer edge of the fourth upper electrode to a minimum value of the distance is less than 2. As a result, the resistance of each of the first upper electrode, the second upper electrode, the third upper electrode, and the fourth upper electrode may be effectively reduced, and a capacitance element having a low ESR may be obtained.

It is preferable that the first upper electrode, the second upper electrode, the third upper electrode, and the fourth upper electrode each have a width in the X-axis direction and a width in the Y-axis direction that are substantially equal to each other. As a result, the resistance of each of the first upper electrode, the second upper electrode, the third upper electrode, and the fourth upper electrode may be further effectively reduced, and a capacitance element having a low ESR may be obtained.

It is also preferable that an electrical resistance of the first connection conductor be lower than an electrical resistance of each of the first upper electrode, the second upper electrode, the third upper electrode, the fourth upper electrode, the first lower electrode, and the second lower electrode. As a result, even if the first connection conductor elongates as the second upper electrode and the fourth upper electrode are expanded in the Y-axis direction, an increase in the resistance of the first connection conductor may be suppressed.

It is further preferable that first groups of the first lower electrode, the first upper electrode, the second upper electrode, the first interlayer conductor, and the second interlayer conductor and second groups of the second lower electrode, the third upper electrode, the fourth upper electrode, the third interlayer conductor, and the fourth interlayer conductor be alternately arranged in the Y-axis direction, and it is preferable that the capacitance element further include a second connection conductor extending in the Y-axis direction at a position that is not adjacent to the first connection conductor in the X-axis direction and connecting the third upper electrode and the first upper electrode, which is adjacent to the third upper electrode, to each other. As a result, the resistance of the first upper electrode and the resistance of the third upper electrode may also be reduced, and a capacitance element having a lower ESR may be obtained.

Preferably, an electrical resistance of the second connection conductor is lower than an electrical resistance of each of the first upper electrode, the second upper electrode, the third upper electrode, the fourth upper electrode, the first lower electrode, and the second lower electrode. As a result, even if the second connection conductor elongates as the first upper electrode and the third upper electrode are expanded in the Y-axis direction, an increase in the resistance of the second connection conductor may be suppressed.

Preferably, the first dielectric layer and the second dielectric layer be ferroelectric layers, and it is preferable that resistance elements forming paths of bias voltages (for variable capacitance control) that are applied between the first lower electrode and the first upper electrode, between the first lower electrode and the second upper electrode, between the second lower electrode and the third upper electrode, and between the second lower electrode and the fourth upper electrode be provided on the substrate. As a result, a variable-capacitance element having a low ESR may be obtained.

According to the present invention, a capacitance element having a reduced ESR without increasing the number of or the area of interlayer conductors can be obtained.

DETAILED DESCRIPTION OF THE PREFERRED EMBODIMENTS

Figure 1A:
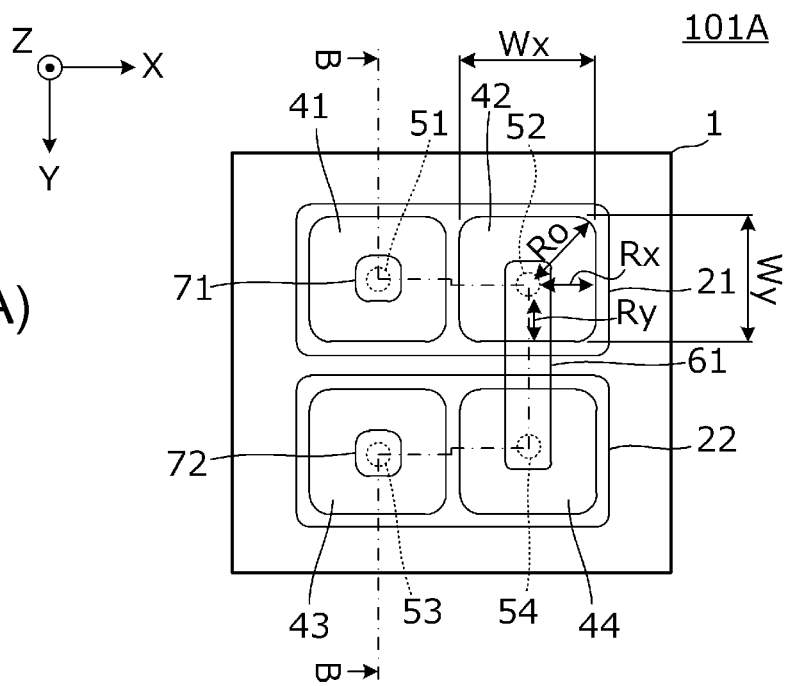
FIG. 1(A) is a plan view of a principal portion of a capacitance element 101A according to a first embodiment.

A plurality of embodiments of the present invention will be described below using some specific examples with reference to the drawings. The same members in the drawings are denoted by the same reference signs. Although the embodiments will be separately described for convenience of description and for ease of explaining and understanding the gist of the present invention, the configurations according to the different embodiments may be partially replaced with one another or may be combined with each other. In the second embodiment and the subsequent embodiments, descriptions of matters that are common to the first embodiment will be omitted, and only differences from the first embodiment will be described. In particular, similar advantageous effects obtained in similar configurations will not be described in every embodiment.

First Embodiment

Figure 1B:
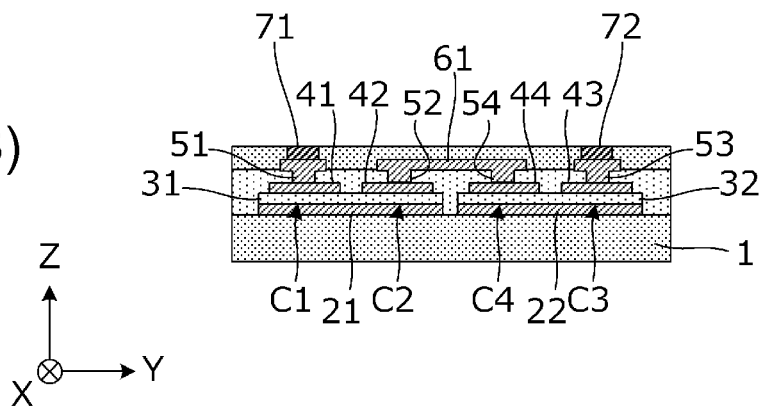
FIG. 1(B) is a sectional view taken along line B-B of FIG. 1(A).

FIG. 1(A) is a plan view of a principal portion of a capacitance element 101A according to the first embodiment, and FIG. 1(B) is a sectional view taken along line B-B of FIG. 1(A).

The capacitance element 101A includes a substrate 1, a conductor, a dielectric, an insulator that are formed on the substrate 1, and so forth. The substrate 1 has a surface extending in the X-axis direction and the Y-axis direction in an X-Y rectangular coordinate system. A first lower electrode 21 and a second lower electrode 22 are disposed on the surface of the substrate 1 so as to be adjacent to each other in the Y-axis direction. A first dielectric layer 31 is formed on the first lower electrode 21, and a second dielectric layer 32 is formed on the second lower electrode 22.

A first upper electrode 41 and a second upper electrode 42 are disposed on the first dielectric layer 31 so as to be adjacent to each other in the X-axis direction, and a third upper electrode 43 and a fourth upper electrode 44 are disposed on the second dielectric layer 32 so as to be adjacent to each other in the X-axis direction.

The first lower electrode 21, the first dielectric layer 31, and the first upper electrode 41 form a first capacitance forming unit C1, and the first lower electrode 21, the first dielectric layer 31, and the second upper electrode 42 form a second capacitance forming unit C2. The second lower electrode 22, the second dielectric layer 32, and the third upper electrode 43 form a fourth capacitance forming unit C4, and the second lower electrode 22, the second dielectric layer 32, and the fourth upper electrode 44 form a third capacitance forming unit C3.

The first upper electrode 41, the second upper electrode 42, the third upper electrode 43, and the fourth upper electrode 44 are respectively in contact with a first interlayer conductor 51, a second interlayer conductor 52, a third interlayer conductor 53, and a fourth interlayer conductor 54.

A first connection conductor 61 connecting the second interlayer conductor 52 and the fourth interlayer conductor 54 to each other is provided above the second upper electrode 42 and the fourth upper electrode 44.

A first outer electrode 71 that is electrically connected to the first interlayer conductor 51 is provided above the first upper electrode 41, and a second outer electrode 72 that is electrically connected to the third interlayer conductor 53 is provided above the third upper electrode 43.

The minimum value of the distance from a portion of the second upper electrode 42, the portion being in contact with the second interlayer conductor 52, to the outer edge of the second upper electrode 42 is a radial dimension Rx along the X-axis or a radial dimension Ry along the Y-axis. The maximum value of the distance is a radial dimension Ro along a diagonal line. In each of the first upper electrode 41, the third upper electrode 43, and the fourth upper electrode 44, the distance relationship between a portion of the upper electrode, the portion being in contact with the corresponding interlayer conductor, and the outer edge of the upper electrode is similar to that in the second upper electrode 42.

In the capacitance element 101A, the X-axis direction in which the first upper electrode 41 and the second upper electrode 42 are arranged adjacent to each other is a direction perpendicular to the direction in which the first connection conductor 61 extends, and thus, the difference between the minimum value Rx (or Ry) of the distance from the portion of the second upper electrode 42 that is in contact with the second interlayer conductor 52 to the outer edge of the second upper electrode 42 and the maximum value Ro of the distance is small (the ratio of these values is close to 1:1). Similarly, the X-axis direction in which the third upper electrode 43 and the fourth upper electrode 44 are arranged adjacent to each other is a direction perpendicular to the direction in which the first connection conductor 61 extends, and thus, the difference between the minimum value of the distance from the portion of the fourth upper electrode 44 that is in contact with the fourth interlayer conductor 54 to the outer edge of the fourth upper electrode 44 and the maximum value of the distance is small. Consequently, the resistance of each of the first upper electrode, the second upper electrode, the third upper electrode, and the fourth upper electrode can be reduced, and a capacitance element having a low ESR can be obtained.

The ratio of the maximum value Ro of the distance from the portion of the second upper electrode 42 that is in contact with the second interlayer conductor 52 to the outer edge of the second upper electrode 42 to the minimum value Rx (or Ry) of the distance is less than 2. This is also common to the first upper electrode 41, the third upper electrode 43, and the fourth upper electrode 44. Consequently, the resistance of each of the first upper electrode, the second upper electrode, the third upper electrode, and the fourth upper electrode is effectively reduced, and the capacitance element 101A having a low ESR is obtained.

In addition, the first upper electrode 41, the second upper electrode 42, the third upper electrode 43, and the fourth upper electrode 44 each have a width Wx in the X-axis direction and a width Wy in the Y-axis direction, the width Wx and the width Wy being substantially equal to each other. This may be defined as follows. If the ratio of the width Wx in the X-axis direction to the width Wy in the Y-axis direction is within a range of ±25%, the width Wx and the width Wy are "substantially equal to each other". By connecting the interlayer conductors to substantially the centers of the corresponding upper electrodes, the resistance of each of the first upper electrode, the second upper electrode, the third upper electrode, and the fourth upper electrode is further effectively reduced, and the capacitance element 101A having a low ESR is obtained.

In the capacitance element 101A, the first connection conductor 61 is, for example, a Cu film, and the first upper electrode 41, the second upper electrode 42, the third upper electrode 43, the fourth upper electrode 44, the first lower electrode 21, and the second lower electrode 22 are Pt films. The electrical resistance of the first connection conductor 61 is lower than the resistance of each of the first upper electrode 41, the second upper electrode 42, the third upper electrode 43, the fourth upper electrode 44, the first lower electrode 21, and the second lower electrode 22. In the present embodiment, although the first connection conductor 61 elongates in the Y-axis direction as the second upper electrode 42 and the fourth upper electrode 44 are expanded in the Y-axis direction, an increase in the resistance of the first connection conductor 61 is suppressed due to the relationship among the above-mentioned resistance values.

Figure 2:
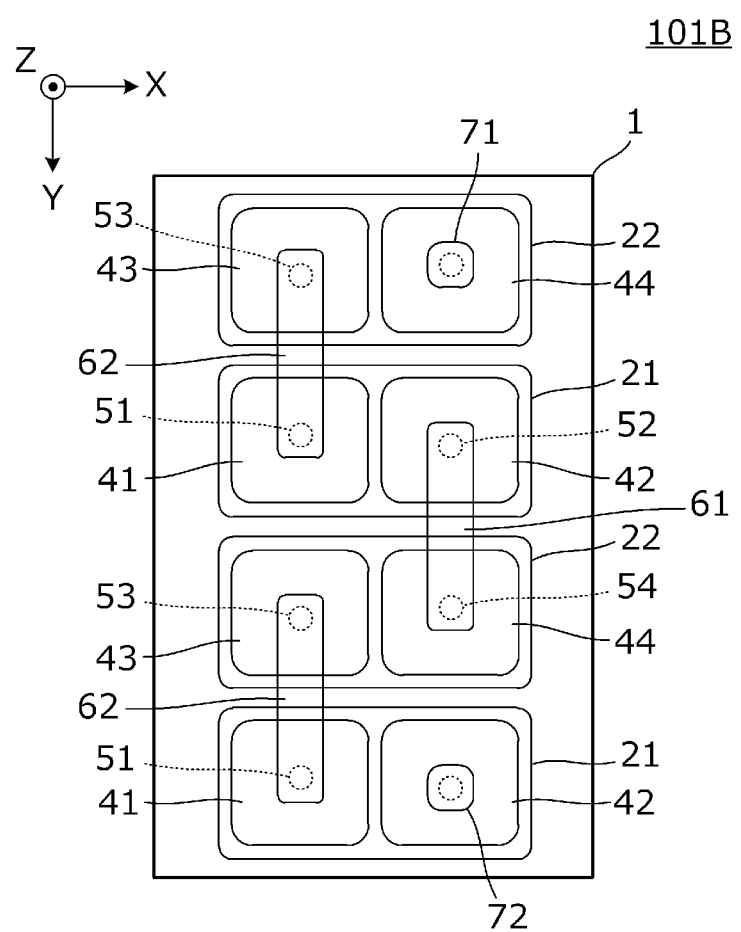
FIG. 2 is a plan view of a principal portion of another capacitance element 101B according to the first embodiment.

FIG. 2 is a plan view of a principal portion of another capacitance element 101B according to the present embodiment. The capacitance element 101B includes the substrate 1, a conductor, a dielectric, an insulator that are formed on the substrate 1, and so forth. The number of the capacitance forming units included in the capacitance element 101B is different from the number of the capacitance forming units included in the capacitance element 101A illustrated in FIGS. 1(A) and 1(B).

The capacitance element 101B includes first groups of the first lower electrode 21, the first upper electrode 41, the second upper electrode 42, the first interlayer conductor 51, and the second interlayer conductor 52 and second groups of the second lower electrode 22, the third upper electrode 43, the fourth upper electrode 44, the third interlayer conductor 53, and the fourth interlayer conductor 54, and the first groups and the second groups are alternately arranged in the Y-axis direction. The capacitance element 101B further includes second connection conductors 62 each of which extends in the Y-axis direction and each of which connects one of the third upper electrodes 43 and one of the first upper electrodes 41 that is adjacent to the third upper electrode 43 to each other. The rest of the configuration of the capacitance element 101B is the same as that of the capacitance element 101A.

In the capacitance element 101B, a capacitance element including five or more capacitance forming units can be formed. In addition, the resistance of each of the first upper electrodes 41 and the third upper electrodes 43, which are connected to each other by the corresponding second connection conductors 62, can also be reduced.

Second Embodiment

In the second embodiment, an example of a variable-capacitance element that includes a bias-voltage application circuit will be described.

Figure 3:
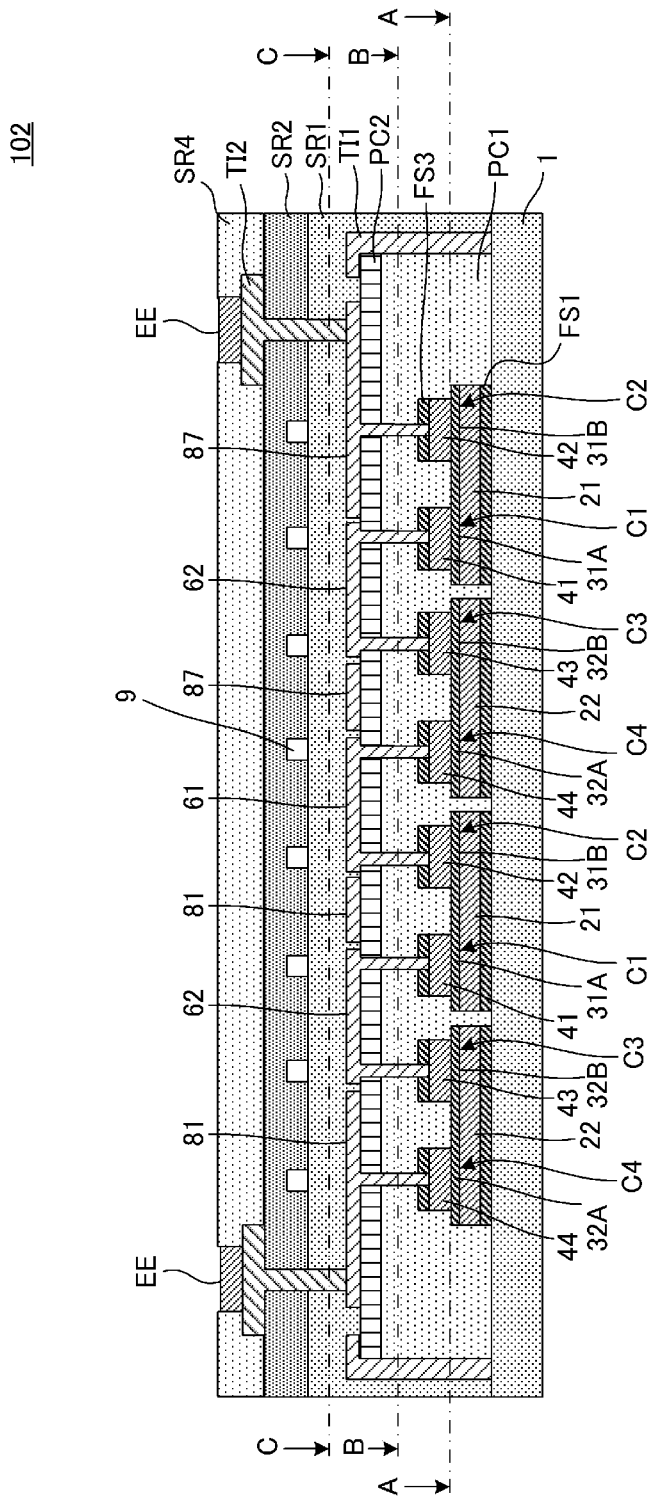
FIG. 3 is a sectional view of a principal portion of a variable-capacitance element 102 according to a second embodiment.
Figure 4A:
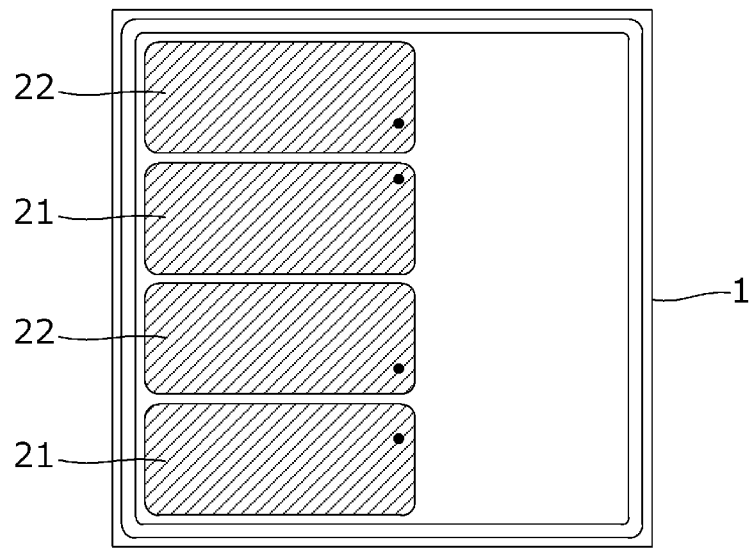
FIG. 4(A) is a cross-sectional view taken along line A-A of FIG. 3.
Figure 4B:
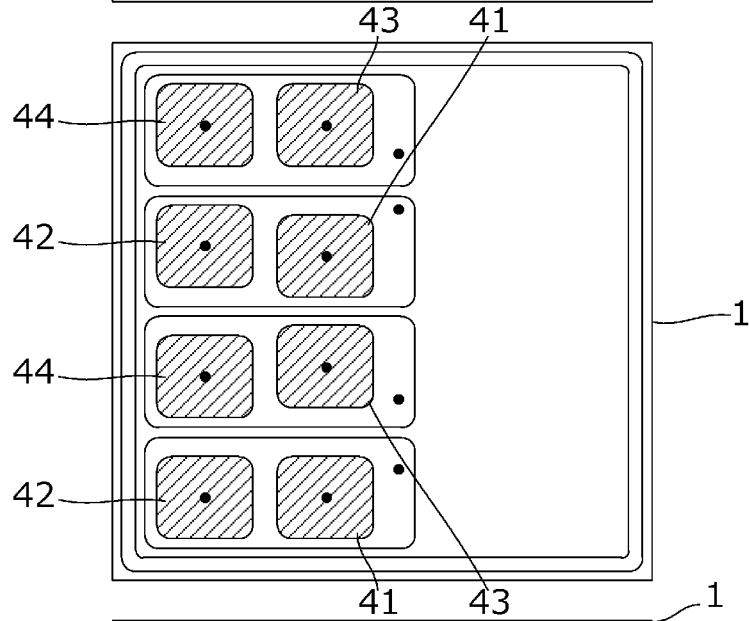
FIG. 4(B) is a cross-sectional view taken along line B-B of FIG. 3.
Figure 4C:
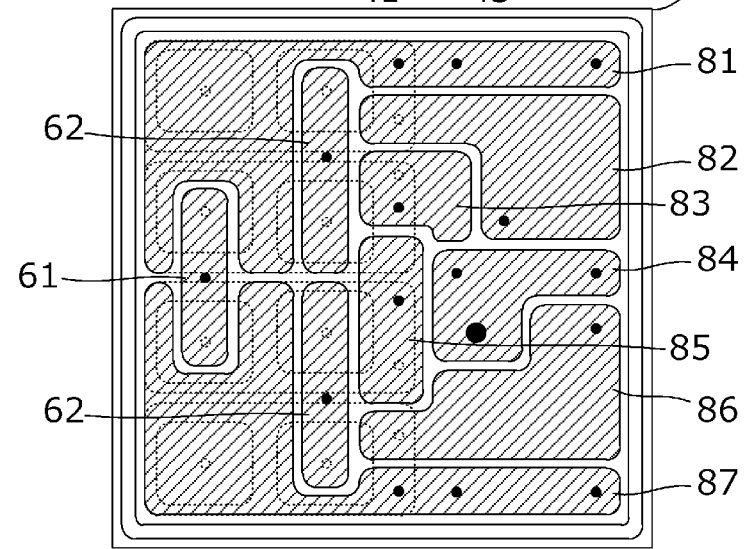
FIG. 4(C) is a cross-sectional view taken along line C-C of FIG. 3.
Figure 5:
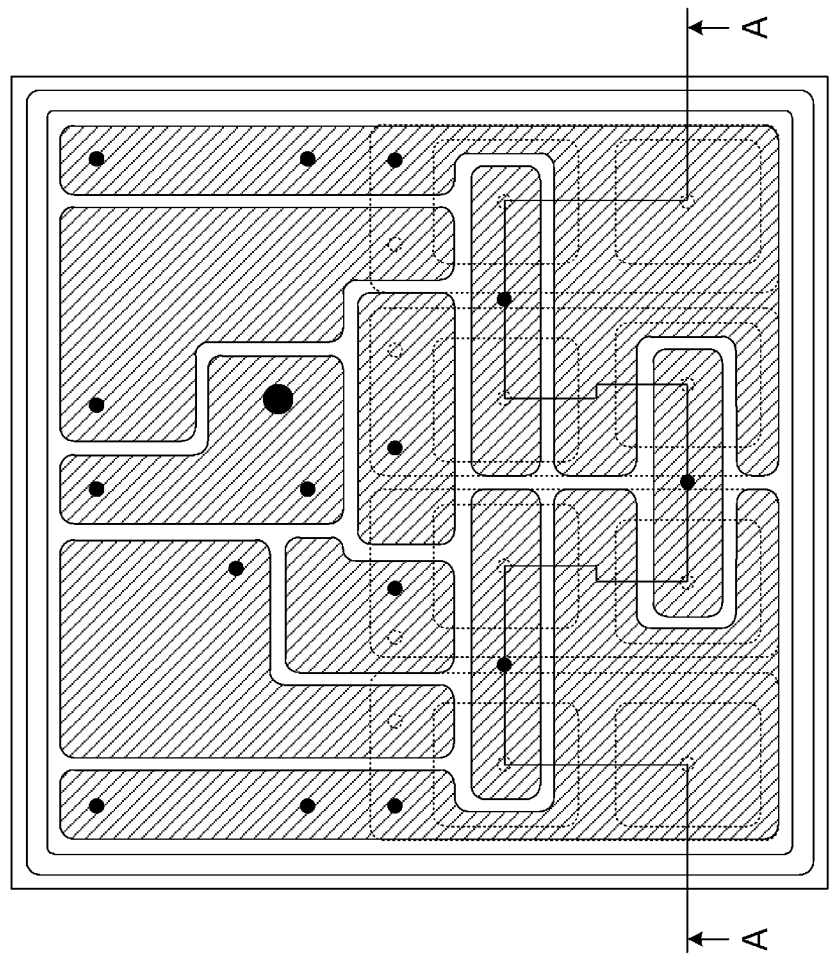
FIG. 5 is a diagram illustrating the position of the cross section illustrated in FIG. 3.

FIG. 3 is a sectional view of a principal portion of a variable-capacitance element 102 according to the second embodiment. FIG. 4(A) is a cross-sectional view taken along line A-A of FIG. 3. FIG. 4(B) is a cross-sectional view taken along line B-B of FIG. 3. FIG. 4(C) is a cross-sectional view taken along line C-C of FIG. 3. FIG. 5 is a diagram illustrating the position of the cross section illustrated in FIG. 3. FIG. 5 is provided as a diagram different from FIG. 4(C) by adding a section line A-A to FIG. 4(C).

In FIG. 3, the substrate 1 is a Si substrate including a $SiO_2$ film formed on a surface thereof. Ferroelectric films FS1, the first lower electrodes 21, the second lower electrodes 22, first dielectric layers 31A and 31B, second dielectric layers 32A and 32B, the first upper electrodes 41, the second upper electrodes 42, the third upper electrodes 43, the fourth upper electrodes 44, and ferroelectric films FS3 are formed on the substrate 1 in this order. As a result, eight capacitance forming units (two pairs of the capacitance forming units C1 to C4) are formed.

The first lower electrodes 21, the second lower electrodes 22, the first upper electrodes 41, the second upper electrodes 42, the third upper electrodes 43, and the fourth upper electrodes 44 are, for example, Pt films or Au films. The above-mentioned first dielectric layers 31A and 31B and the above-mentioned second dielectric layers 32A and 32B are ferroelectric films.

A moisture-resistant protective film PC1 coats upper portions of the capacitance forming units C1 to C4 and an upper portion of the substrate 1. An organic protective film PC2 is formed on the moisture-resistant protective film PC1.

A wiring film TI1 is formed on the organic protective film PC2. The wiring film TI1 is connected to predetermined portions of the first upper electrodes 41, the second upper electrodes 42, the third upper electrodes 43, and the fourth upper electrodes 44 via contact holes. In addition, the wiring film TI1 is formed so as to cover the peripheries of the moisture-resistant protective film PC1 and the organic protective film PC2.

An interlayer insulating film SR1 is formed on a surface of the wiring film TI1. Resistance elements 9 are formed on a surface of the interlayer insulating film SR1.

A resistive film of each of the resistance elements 9 is formed by a thin-film process (a process using photolithography and etching techniques) or a thick-film process (a process using a printing technique such as screen printing). The resistance of each of the resistance elements is set by the width of, the length of, and the thickness of a resistive film pattern.

A wiring film TI2 is formed on a surface of an interlayer insulating film SR2. The wiring film TI2 is connected to the wiring film TI1 via contact holes formed in the interlayer insulating films SR1 and SR2.

A solder resist film SR4 coats the surface of the interlayer insulating film SR2. External connecting electrodes EE are formed so as to be located in openings formed in the solder resist film SR4 and on a surface of the wiring film TI2.

The above-mentioned ferroelectric films FS1 are insulating films for adhesion and for preventing diffusion with respect to the substrate 1 and the moisture-resistant protective film PC1. The ferroelectric films FS3 are insulating films for adhesion with respect to the moisture-resistant protective film PC1.

As a thin-film material used for making the first dielectric layers 31A and 31B, the second dielectric layers 32A and 32B, the ferroelectric films FS1 and FS3, which have been mentioned above, a dielectric material having a high dielectric constant is used. More specifically, a perovskite compound such as $(Ba,Sr)TiO_3$ (BST), $SrTiO_3$, $BaTiO_3$, or $Pb(Zr,Ti)O_3$, a bismuth-layered compound such as $SrBi4Ti_4O_{15}$, and the like can be used.

The wiring films TI1 and TI2 are each formed of three layers of Ti/Cu/Ti. A film thickness of the Ti layer is formed to be, for example, 30 nm to 300 nm, and a film thickness of the Cu layer is formed to be, for example, 500 nm to 1,500 nm.

The external connecting electrodes EE are each formed of two layers of Au/Ni. The Ni layer, which is a first layer, is formed to be, for example, 1,000 nm to 3,000 nm, and the Au layer, which is a second layer, is formed to be, for example, a film thickness of 100 nm to 300 nm.

The moisture-resistant protective film PC1 prevents moisture that is released from the organic protective film PC2 from entering a capacitor section. As the material of the moisture-resistant protective film PC1, $SiN_x$, $SiO_2$, $Al_2O_3$, $TiO_2$, or the like can be used. The organic protective film PC2 absorbs mechanical stress from the outside. As the material of the organic protective film PC2, polybenzoxazole (PBO) resin, a polyimide resin, an epoxy resin, or the like can be used.

The resistance material of each of the above-mentioned resistance elements 9 is, for example, an alloy containing Ni and Cr as main components or an alloy containing Ni, Cr, and Si as main components.

The configurations of the first lower electrodes 21 and the second lower electrodes 22, which are illustrated in FIG. 4(A), the basic configurations of the first upper electrodes 41, the second upper electrodes 42, the third upper electrodes 43, and the fourth upper electrodes 44, which are illustrated in FIG. 4(B), and the basic configurations of the first connection conductor 61 and the second connection conductors 62, which are illustrated in FIG. 4(C), are the same as the configurations of the corresponding electrodes and the corresponding connection conductors in the capacitance element 101B according to the first embodiment, which is illustrated in FIG. 2. In FIG. 4(C), conductor patterns 81 to 87 are electrically connected to the upper electrodes 41 to 44, the resistance elements 9, and so forth.

In FIGS. 4(A), 4(B), and 4(C), a space of the substrate 1 that is located on the right side of a region in which the lower electrodes 21 and 22 are formed is a region used for forming an element such as a Zener diode for electrostatic discharge (ESD) protection.

Note that, as illustrated in FIG. 4(C), the first connection conductor 61, the second connection conductors 62, and the conductor patterns 81 to 87 are formed so as to cover substantially the entire front surface of the substrate 1, so that the structural and mechanical strengths is enhanced. In addition, the flatness is improved, and the risk of breakage of a wiring pattern that is formed on a layer located above the layer in which these conductors are formed is reduced.

A method of manufacturing the variable-capacitance element 102 illustrated in FIG. 3 is as follows.

First, a thermal oxidation treatment is performed on a Si substrate, and an oxide layer that has a film thickness of 700 nm and that is made of $SiO_2$ is formed. Although the film thickness of this oxide layer is not particularly limited as long as a desired insulating property can be ensured with the film thickness, the film thickness is preferably set within a range of 500 nm to 1,000 nm.

Next, the ferroelectric films FS1 for adhesion and for preventing diffusion each having a film thickness of 50 nm are formed onto the above-mentioned oxide layer by a chemical solution deposition (hereinafter referred to as CSD) method. Although the film thickness of each of the ferroelectric films FS1 is not particularly limited as long as a desired adhesive property and a desired diffusion preventive property can be ensured with the film thickness, the film thickness is preferably set within a range of 10 nm to 100 nm.

Although examples of the material that can be used for making the ferroelectric films FS1 are those mentioned above, it is preferable that the ferroelectric films FS1 be made of the same material as the dielectric layer 31A, 31B, 32A, and 32B. For example, when a BST film is formed, a film-deposition material solution containing Ba, Sr, and Ti mixed at a molar ratio of, for example, Ba:Sr:Ti=7:3:10 is prepared. Then, the film-deposition material solution is applied to the substrate 1, dried on a hot plate at 400° C., and is subjected to a heat treatment at 600° C. for 30 minutes so as to be crystallized, so that a BST film is formed.

Although the temperature of the above-mentioned hot plate is not particularly limited as long as a desired drying property is obtained, the temperature is preferably set within a range of 300° C. to 400° C. Although the temperature at which the above-mentioned heat treatment is performed is not particularly limited as long as desired crystallization is performed, the temperature is preferably set within a range of 600° C. to 700° C. Although the length of time over which the above-mentioned heat treatment is performed is not particularly limited as long as desired crystallization is performed, the length of time is preferably set within a range of 10 minutes to 60 minutes.

Next, the lower electrodes 21 and 22, the dielectric layers 31A, 31B, 32A, and 32B, the upper electrodes 41, 42, and 43, 44 and the ferroelectric films FS3 are sequentially formed into films. More specifically, the lower electrodes 21 and 22 each of which has a film thickness of 250 nm and each of which is made of Pt or Au are formed by an RF magnetron sputtering method. Then, the dielectric layers 31A, 31B, 32A, and 32B each of which is made of, for example, BST and each of which has a film thickness of 100 nm are formed by a CSD technique. Subsequently, the upper electrodes 41, 42, 43, and 44 each of which has a film thickness of 250 nm and each of which is made of Pt or Au are formed by the RF magnetron sputtering method. In addition, the ferroelectric films FS3 each of which is made of, for example, BST and each of which has a film thickness of 100 nm are formed by the CSD technique.

Although the film thicknesses of the lower electrodes 21 and 22, the upper electrodes 41, 42, 43, and 44 are not particularly limited as long as a desired low resistance can be ensured with the film thicknesses, each of the film thicknesses is preferably set within a range of 100 nm to 500 nm. Although the film thicknesses of the dielectric layers 31A, 31B, 32A, and 32B are not particularly limited as long as a desired electrostatic capacitance can be ensured with the film thicknesses, each of the film thicknesses is preferably set within a range of 80 nm to 150 nm. Although the film thicknesses of the ferroelectric films FS3 are not particularly limited as long as a desired adhesive property can be ensured with the film thicknesses, each of the film thicknesses is preferably set within a range of 80 nm to 150 nm.

Next, each layer of the capacitor section is patterned by a photolithography technique and a dry etching method (reactive ion etching (RIE) method). In other words, application and prebaking of a photoresist are performed, after which ultraviolet light is radiated onto the photoresist through a photomask. Then, light exposure, development, and postbaking are performed, and a photomask pattern is transferred onto a resist pattern. Subsequently, dry etching is performed on an exposed portion by using Ar gas or $CHF_3$ gas.

Following this, the capacitance forming units C1 to C4 are subjected to a heat treatment at 800° C. for 30 minutes. Although the temperature at which the heat treatment is performed is not particularly limited as long as desired heat treatability is obtained, the temperature is preferably set within a range of 800° C. to 900° C. Although the length of time over which the heat treatment is performed is not particularly limited as long as desired heat treatability is obtained, the length of time is preferably set within a range of 10 minutes to 60 minutes.

Next, the moisture-resistant protective film PC1 that has a film thickness of 600 nm and that is made of an inorganic material is formed by a sputtering method so as to cover the top and side surfaces of the capacitance forming units and the side surfaces of the ferroelectric films FS1. Subsequently, polybenzoxazole (PBO), which is a photosensitive resin material, is applied so as to be formed into a film covering the above-mentioned moisture-resistant protective film PC1 by a spin coating method. Then, the film is heated at 125° C. for 5 minutes and is subjected to light exposure and development. After that, the film is heated at 350° C. for about 1 hour, so that the organic protective film PC2 having a film thickness of 6,000 nm is formed in a predetermined pattern.

Although the film thickness of the moisture-resistant protective film PC1 is not particularly limited as long as a desired moisture-resistant protective property can be ensured with the film thickness, the film thickness is preferably set within a range of 200 nm to 1,000 nm. Although the film thickness of the organic protective film PC2 is not particularly limited as long as a desired mechanical-stress absorbing property can be ensured with the film thickness, the film thickness is preferably set within a range of 2,000 nm to 10,000 nm.

Next, while the organic protective film PC2 is used as a mask, the organic protective film PC2, the moisture-resistant protective film PC1, and the dielectric layers 31A, 31B, 32A, and 32B are patterned by dry etching using $CHF_3$ gas, and contact holes (not illustrated) extending to the lower electrodes 21 and 22 are formed. In addition, the organic protective film PC2, the moisture-resistant protective film PC1, and the dielectric layers 31A, 31B, 32A, and 32B are patterned by dry etching, and contact holes extending to the upper electrodes 41 to 44 are formed.

In the present embodiment, the dielectric layers 31A and 31B are continuous with each other, and the dielectric layers 32A and 32B are continuous with each other.

Next, three metal layers that are to be the wiring film TI1 are formed by an RF magnetron sputtering method, and the wiring film TI1 is patterned by wet etching.

Next, the interlayer insulating film SR1 is spin-coated, and a resistive film that is to be the resistance elements 9 of the variable-capacitance element is formed by a thin-film process such as sputtering or electron beam evaporation or by a thick-film process performed by applying a paste. Then, this resistive film is patterned by a lift-off technique, so that the resistance elements 9 are formed.

Next, the interlayer insulating film SR2 is spin-coated, and contact holes extending to the wiring film TI1 are formed.

Next, the solder resist film SR4 is spin-coated, and openings are formed in the solder resist film SR4 at predetermined positions. Then, the external connecting electrodes EE are formed by electrolytic plating.

Note that the present invention is not limited to the above-described embodiments. For example, the film thickness, the forming method, the forming conditions, and the like of each layer described in the above-described embodiments are merely examples and may each be arbitrarily changed within a range in which its expected function as a thin-film capacitor is not impaired.

In addition, in the above-described embodiments, although a case has been described in which the capacitor section has a single-layer structure including one capacitance generating unit, the present invention can also be applied to a multilayer structure including two or more capacitance generating units.

Figure 6:
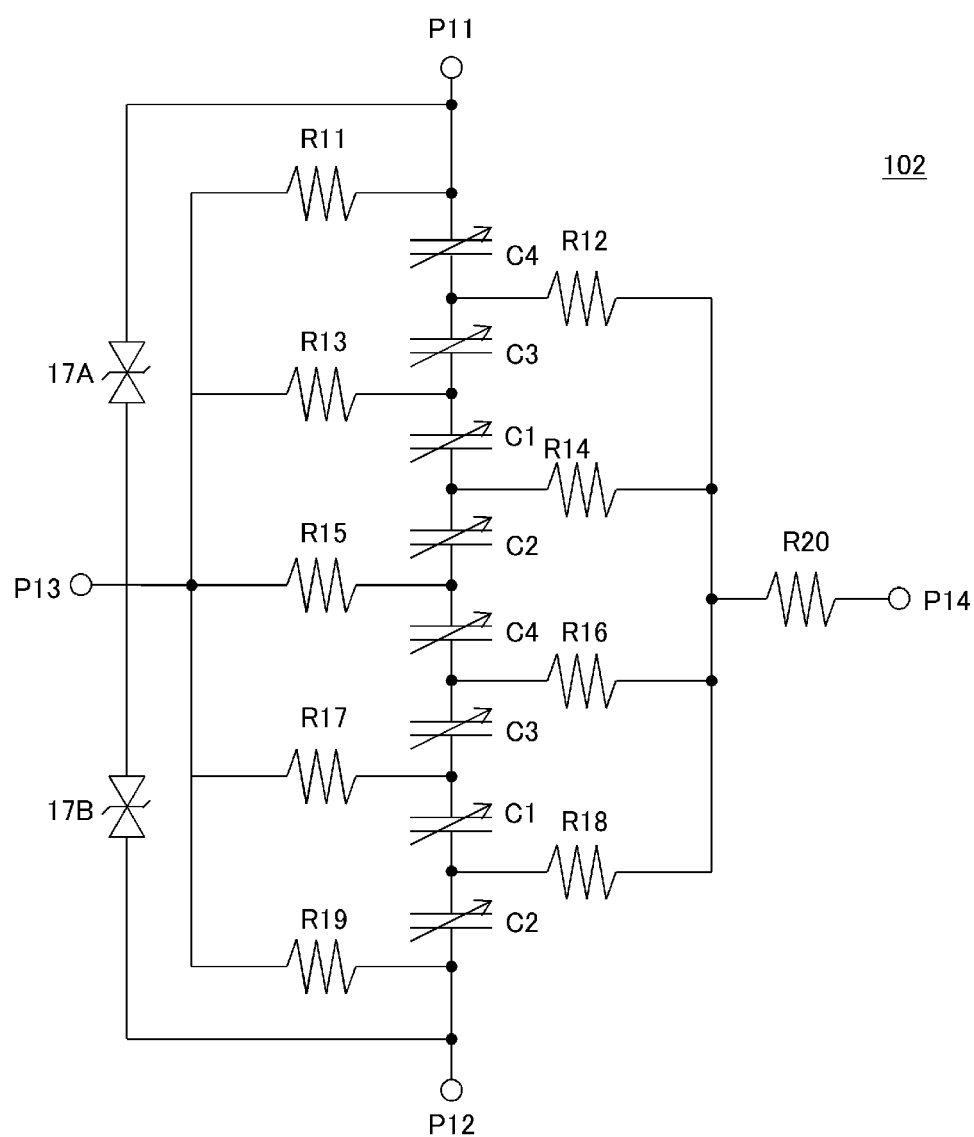
FIG. 6 is a circuit diagram of the variable-capacitance element 102.

FIG. 6 is a circuit diagram of the variable-capacitance element 102. A port P11 and a port P12 are input and output terminals for high-frequency signals, and a port P13 and a port P14 are respectively a ground terminal and an applied-voltage control terminal (tuning terminal). The variable-capacitance element 102 includes the capacitance forming units C1 to C8 and resistance elements R11 to R20. The resistance elements R11 to R20 are bias-voltage paths. A bias voltage is applied by these resistance elements R11 to R20, and a high-frequency component is cut off by these resistance elements R11 to R20. The capacitance values of the capacitance forming units C1 to C4 are determined in accordance with the voltage applied between the ports P13 and P14. Accordingly, the capacitance value between the ports P11 and P12 of the variable-capacitance element 102 is determined in accordance with the voltage applied between the ports P13 and P14. The port P13 is used as a ground terminal. ESD protection elements 17A and 17B are respectively disposed between the port P13 and the port P11 and between the port P13 and the port P12.

Figure 7:
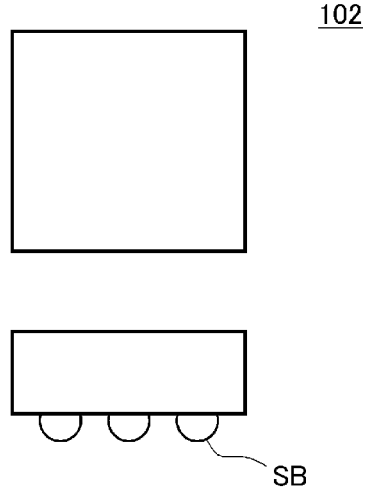
FIG. 7 is a diagram illustrating three surfaces of the variable-capacitance element 102.

FIG. 7 is a diagram illustrating three surfaces of the variable-capacitance element 102. Terminal electrodes that correspond to the port P11 and the port P12, which are input and output terminals for high-frequency signals, to the port P13, which is a ground terminal, and to the port P14, which is an applied-voltage control terminal, are formed on a mounting surface. Note that terminal electrodes other than the above terminal electrodes are NC-terminal (vacant-terminal) electrodes. As illustrated in FIG. 3, the variable-capacitance element 102 is a bare chip separated from a wafer. Solder balls SB are formed on the external connecting electrodes (pads) EE of the IC.

Note that, in the case illustrated in FIG. 3, although the first dielectric layers 31A and 31B are continuous with each other, and the second dielectric layers 32A and 32B are also continuous with each other, these dielectric layers may be formed independently of each other.

Third Embodiment

In the third embodiment, a communication circuit that includes the variable-capacitance element, which has been described above, will be described.

Figure 8:
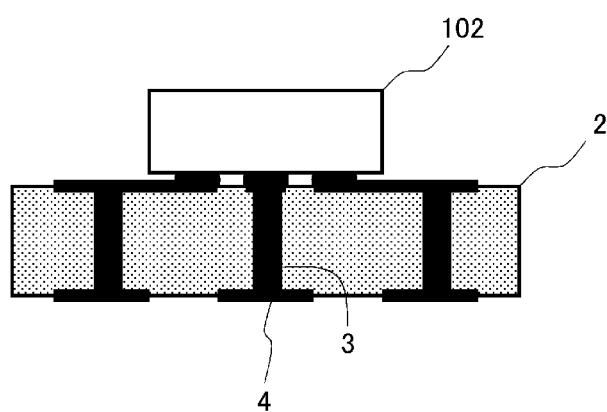
FIG. 8 is a sectional view illustrating a state where the variable-capacitance element 102 has been mounted on a mounting rewiring substrate 2.

FIG. 8 is a sectional view illustrating a state where the variable-capacitance element 102 has been mounted on a mounting rewiring substrate 2. Mounting terminals 4 are formed on the bottom surface of the mounting rewiring substrate 2, and electrodes onto which the variable-capacitance element 102 is mounted are formed on the top surface of the mounting rewiring substrate 2. Rewiring electrodes 3 are formed in the mounting rewiring substrate 2. As described above, a module in which the variable-capacitance element 102 is mounted on the mounting rewiring substrate 2 is mounted onto a circuit wiring board.

Figure 9:
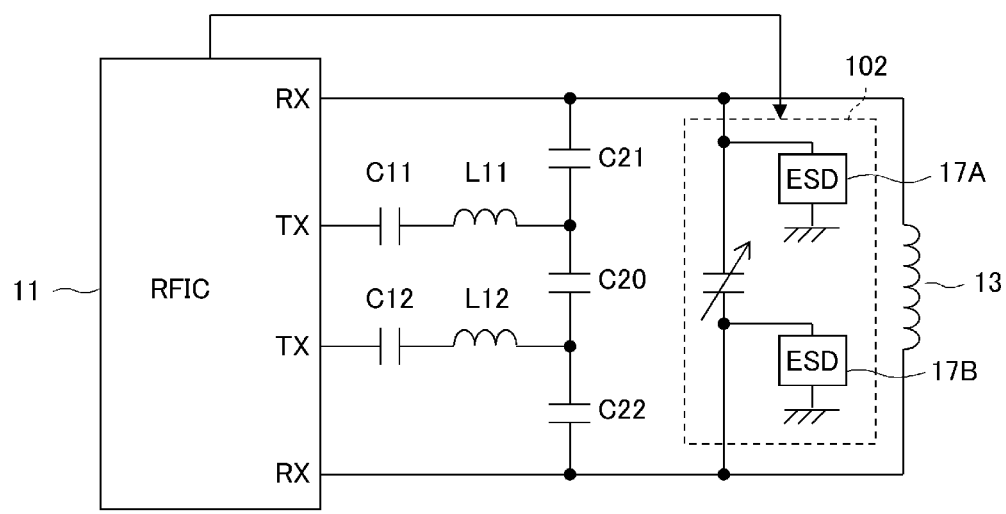
FIG. 9 is a circuit diagram of a communication circuit according to a third embodiment.
Figure 10:
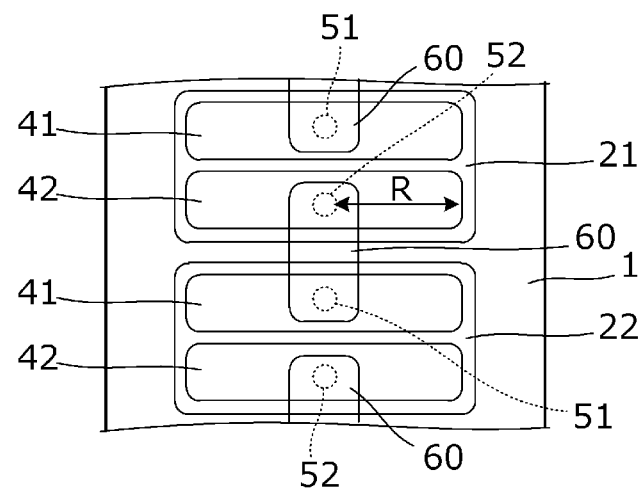
FIG. 10 is a diagram illustrating the basic configuration of a capacitance element disclosed in Patent Document 1.

FIG. 9 is a circuit diagram of a communication circuit formed on the above-mentioned circuit board. In FIG. 9, an antenna coil 13 is configured to function as a radiating element and transmits and receives radio signals to and from a communication-target coil antenna by being magnetically coupled to the communication-target coil antenna. The antenna coil 13 is formed by winding a loop-shaped electrode pattern in a plurality of turns or in a plurality of layers.

Capacitors C21 and C22 are elements for adjusting the degree of coupling of an RFIC 11 and the antenna coil 13. Inductors L11 and L12 and capacitors C11, C12, and C20 form a transmission filter. For example, when the communication circuit operates in a card mode, the RFIC 11 operates passively. Accordingly, the RFIC 11 generates a power-supply voltage from an input signal input to an RX terminal and reads a reception signal. At the time of transmission, the RFIC 11 performs load modulation of a circuit (load) connected to a TX terminal. In addition, for example, when the communication circuit operates in a reader-writer mode, the RFIC 11 operates actively. Accordingly, at the time of transmission, the RFIC 11 opens the RX terminal and transmits a transmission signal from the TX terminal. At the time of reception, the RFIC 11 opens the TX terminal and inputs a reception signal from the RX terminal. In this manner, in the communication circuit, the impedance when the antenna coil 13 is seen from the RFIC 11 changes in accordance with the operation mode of the communication circuit. As will be described later, the variable-capacitance element 102 is controlled such that the resonant frequency of an antenna circuit is optimized in accordance with the operation mode (such that the impedance when the antenna coil 13 is seen from the RFIC 11 matches).

FIG. 9 illustrates, including an ESD protection circuit, the variable-capacitance element 102. ESD protection elements 17A and 17B are respectively connected between one end of the antenna coil 13 and the ground and between the other end of the antenna coil 13 and the ground.

For example, the antenna coil 13 is formed on a circuit board, and the RFIC 11, the capacitors C11, C12, C20, C21, and C22, the inductors L11 and L12, and the module illustrated in FIG. 8 are mounted on the circuit board.

Note that the variable-capacitance element may be independently connected in parallel to the antenna coil, or a capacitor may be inserted in series with respect to the variable-capacitance element. Alternatively, the variable-capacitance element may be connected in series to the antenna coil.

The communication circuit according the present embodiment is not limited to a reader-writer of an RFID and may be formed as an RFID tag.

Lastly, the descriptions of the above embodiments are examples in all respects, and the present invention is not limited to the embodiments. Modifications and changes can be suitably made by those skilled in the art. The scope of the present invention is to be determined not by the above-described embodiments, but by the claims. In addition, changes within the scope of the claims and their equivalents made to the embodiments are included in the scope of the present invention.

REFERENCE SIGNS LIST

C1 first capacitance forming unit
C2 second capacitance forming unit
C3 third capacitance forming unit
C4 fourth capacitance forming unit
C11, C12, C20, C21, C22 capacitor
EE external connecting electrode
FS1, FS3 ferroelectric film
L11, L12 inductor
PC1 moisture-resistant protective film
PC2 organic protective film
R11 to R20 resistance element
SB solder ball
SR1, SR2 interlayer insulating film
TI1, 112 wiring film
substrate
mounting rewiring substrate
rewiring electrode
mounting terminal
9 resistance element
11 RFIC
13 antenna coil
17A, 17B ESD protection element
21 first lower electrode
22 second lower electrode
31, 31A, 31B first dielectric layer
32, 32A, 32B second dielectric layer
41 first upper electrode
42 second upper electrode
43 third upper electrode
44 fourth upper electrode
51 first interlayer conductor
52 second interlayer conductor
53 third interlayer conductor
54 fourth interlayer conductor
60 connection conductor
61 first connection conductor
62 second connection conductor
71 first outer electrode
72 second outer electrode
81 to 87 conductor pattern
101A, 101B capacitance element
102 variable-capacitance element

The invention claimed is:

1. A capacitance element comprising:
a substrate that has a surface extending in an X-axis direction and a Y-axis direction in an X-Y rectangular coordinate system;
a first lower electrode and a second lower electrode on the surface of the substrate and positioned adjacent to and spaced from each other in the Y-axis direction;
a first dielectric layer on the first lower electrode;
a second dielectric layer on the second lower electrode;
a first upper electrode and a second upper electrode on the first dielectric layer and positioned adjacent to and spaced from each other in the X-axis direction;
a third upper electrode and a fourth upper electrode on the second dielectric layer and positioned adjacent to and spaced from each other in the X-axis direction, wherein the third upper electrode is positioned adjacent to the first upper electrode in the Y-axis direction, and the fourth upper electrode is positioned adjacent to the second upper electrode in the Y-axis direction;
a first interlayer conductor in contact with the first upper electrode;
a second interlayer conductor in contact with the second upper electrode;
a third interlayer conductor in contact with the third upper electrode;
a fourth interlayer conductor in contact with the fourth upper electrode; and
a first connection conductor connecting the second interlayer conductor and the fourth interlayer conductor to each other and extending in the Y-axis direction.

2. The capacitance element according to claim 1, wherein a ratio of a maximum value of a first distance from a first portion of the first upper electrode in contact with the first interlayer conductor to an outer edge of the first upper electrode to a minimum value of the first distance is less than 2,
wherein a ratio of a maximum value of a second distance from a second portion of the second upper electrode in contact with the second interlayer conductor to an outer edge of the second upper electrode to a minimum value of the second distance is less than 2,
wherein a ratio of a maximum value of a third distance from a third portion of the third upper electrode in contact with the third interlayer conductor to an outer edge of the third upper electrode to a minimum value of the third distance is less than 2, and
wherein a ratio of a maximum value of a fourth distance from a fourth portion of the fourth upper electrode in contact with the fourth interlayer conductor to an outer edge of the fourth upper electrode to a minimum value of the fourth distance is less than 2.

3. The capacitance element according to claim 2, wherein the first upper electrode, the second upper electrode, the third upper electrode, and the fourth upper electrode each have a width in the X-axis direction and a width in the Y-axis direction that are substantially equal to each other.

4. The capacitance element according to claim 1, wherein the first upper electrode, the second upper electrode, the third upper electrode, and the fourth upper electrode each have a width in the X-axis direction and a width in the Y-axis direction that are substantially equal to each other.

5. The capacitance element according to claim 1, wherein an electrical resistance of the first connection conductor is lower than an electrical resistance of each of the first upper electrode, the second upper electrode, the third upper electrode, the fourth upper electrode, the first lower electrode, and the second lower electrode.

6. The capacitance element according to claim 1, further comprising:
a third lower electrode on the surface of the substrate and positioned adjacent to and spaced from the first lower electrode in the Y-axis direction;
a third dielectric layer on the third lower electrode;
a fifth upper electrode and a sixth upper electrode on the third dielectric layer and positioned adjacent to and spaced from each other in the X-axis direction, wherein the fifth upper electrode is positioned adjacent to the first upper electrode in the Y-axis direction, and the sixth upper electrode is positioned adjacent to the second upper electrode in the Y-axis direction;
a fifth interlayer conductor in contact with the fifth upper electrode;
a sixth interlayer conductor in contact with the sixth upper electrode; and a second connection conductor connecting the first interlayer conductor and the fifth interlayer conductor to each other and extending in the Y-axis direction.

7. The capacitance element according to claim 6, further comprising:
a fourth lower electrode on the surface of the substrate and positioned adjacent to and spaced from the second lower electrode in the Y-axis direction;
a fourth dielectric layer on the fourth lower electrode;
a seventh upper electrode and an eighth upper electrode on the fourth dielectric layer and positioned adjacent to and spaced from each other in the X-axis direction, wherein the seventh upper electrode is positioned adjacent to the third upper electrode in the Y-axis direction, and the eighth upper electrode is positioned adjacent to the fourth upper electrode in the Y-axis direction;
a seventh interlayer conductor in contact with the seventh upper electrode;
an eighth interlayer conductor in contact with the eighth upper electrode; and
a third connection conductor connecting the third interlayer conductor and the seventh interlayer conductor to each other and extending in the Y-axis direction.

8. The capacitance element according to claim 7, wherein an electrical resistance of the second connection conductor is lower than an electrical resistance of each of the first upper electrode, the second upper electrode, the third upper electrode, the fourth upper electrode, the first lower electrode, and the second lower electrode.

9. The capacitance element according to claim 8, wherein an electrical resistance of the third connection conductor is lower than an electrical resistance of each of the first upper electrode, the second upper electrode, the third upper electrode, the fourth upper electrode, the first lower electrode, and the second lower electrode.

10. The capacitance element according to claim 6, wherein an electrical resistance of the second connection conductor is lower than an electrical resistance of each of the first upper electrode, the second upper electrode, the third upper electrode, the fourth upper electrode, the first lower electrode, and the second lower electrode.

11. The capacitance element according to claim 1,
wherein the first dielectric layer and the second dielectric layer are ferroelectric layers, and
wherein resistance elements forming paths of bias voltages between the first lower electrode and the first upper electrode, between the first lower electrode and the second upper electrode, between the second lower electrode and the third upper electrode, and between the second lower electrode and the fourth upper electrode are provided on the substrate.

* * * * *